(12) United States Patent
Mohammad et al.

(10) Patent No.: US 7,567,096 B2
(45) Date of Patent: Jul. 28, 2009

(54) CIRCUIT DEVICE AND METHOD OF CONTROLLING A VOLTAGE SWING

(75) Inventors: Baker Mohammad, Austin, TX (US); Martin Saint-Laurent, Austin, TX (US); Paul Bassett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/843,696

(22) Filed: Aug. 23, 2007

(65) Prior Publication Data

US 2008/0231322 A1    Sep. 25, 2008

Related U.S. Application Data

(60) Provisional application No. 60/896,090, filed on Mar. 21, 2007.

(51) Int. Cl.
*H03K 19/096* (2006.01)
(52) U.S. Cl. ............................. 326/96; 326/98; 326/34; 326/80
(58) Field of Classification Search .................. 326/31, 326/33, 34, 68, 80, 81, 93–98; 327/538, 327/540, 544
See application file for complete search history.

(56) References Cited

U.S. PATENT DOCUMENTS 5,760,620 A     6/1998  Doluca 6,570,415 B2    5/2003  Chen et al.
7,312,640 B2   12/2007  Horiguchi et al.
2005/0116737 A1*  6/2005  Pentakota et al. ............. 326/31

FOREIGN PATENT DOCUMENTS

EP    1134894    9/2001

OTHER PUBLICATIONS

International Search Report-PCT/US08/057952, International Search Authority-European Patent Office-Aug. 4, 2008.
Written Opinion-PCT/US08/057952, International Search Authority-European Patent Office-Aug. 4, 2008.

* cited by examiner

*Primary Examiner*—James H. Cho
*Assistant Examiner*—Jany Tran
(74) *Attorney, Agent, or Firm*—Nicholas J. Pauley; Peter M. Kamarchik; Joseph B. Agusta (57) ABSTRACT

In particular illustrative embodiments, circuit devices and methods of controlling a voltage swing are disclosed. The method includes receiving a signal at an input of a digital circuit device including a capacitive node. The method also includes selectively activating a voltage level adjustment element to regulate an electrical discharge path from the capacitive node to an electrical ground to prevent complete discharge of the capacitive node. In a particular illustrative embodiment, the received signal may be a clock signal.

20 Claims, 10 Drawing Sheets

CIRCUIT DEVICE AND METHOD OF CONTROLLING A VOLTAGE SWING

CLAIM OF PRIORITY UNDER 35 U.S.C. §119

The present Application for Patent claims priority to Provisional Application No. 60/896,090 entitled "Circuit Producing a Signal Having a Reduced Voltage Swing" filed Mar. 21, 2007, and assigned to the assignee hereof and hereby expressly incorporated by reference herein.

I. FIELD

The present disclosure is generally related to a circuit device and method of controlling a voltage swing.

II. DESCRIPTION OF RELATED ART

Advances in technology have resulted in smaller and more powerful personal computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and IP telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Generally, as processing power of integrated circuits increases, power consumption can also increase. For mobile electronics, such as wireless telephones, PDAs, and other portable electronic devices, power consumption considerations increase component and design costs and may impact speed and performance.

Conventionally, circuit designers have attempted to reduce power consumption by reducing voltage swing, in part, because significant power may be consumed by switching capacitances within a particular circuit device. However, such attempts to reduce power consumption may impact at least one of the circuit speed, the circuit area, and the wiring routing complexity. In some instances, multiple power supplies have been introduced to reduce voltage swing, increasing the cost and complexity of the integrated circuit. Hence, there is a need for an improved circuit device and method of controlling a voltage swing.

III. SUMMARY

In a particular illustrative embodiment, a method of controlling a voltage swing is disclosed that includes receiving a clock signal at an input of a digital circuit device including a capacitive node. The method further includes selectively activating a voltage level adjustment element to regulate an electrical discharge path from the capacitive node to an electrical ground to prevent complete discharge of the capacitive node.

In another particular illustrative embodiment, a circuit device is disclosed that includes an input to receive a digital logic value, a logic device responsive to the input, and a capacitive node coupled to the logic device. The circuit device further includes a voltage level adjustment element coupled to the capacitive node and adapted to increase a logic low voltage level to a voltage level above a logic low level of the input.

In still another particular illustrative embodiment, a circuit device is disclosed that includes an input to a circuit element and a capacitive node that is coupled to the circuit element and that is responsive to the input. The circuit device further includes a voltage level adjustment element that is coupled to the capacitive node and is adapted to provide an electrical discharge path to an electrical ground for the capacitive node. The voltage level adjustment element regulates the electrical discharge path to prevent complete discharge of the capacitive node when a signal at the input is at a logic low voltage level.

In yet another particular illustrative embodiment, a circuit device includes means for receiving a clock signal at an input of a digital circuit device including a capacitive node. The circuit device also includes means for selectively activating a voltage level adjustment element to regulate an electrical discharge path from the capacitive node to an electrical ground to prevent complete discharge of the capacitive node One particular advantage provided by embodiments of a voltage swing adjustment circuit is provided in that overall power consumption may be reduced without impacting speed by reducing a voltage swing of a clock signal or of other signals, thereby reducing power consumption due to switched capacitances.

Another particular advantage is provided by embodiments of the voltage swing adjustment in that voltage swing adjustment circuit can be used to throttle a discharge path of a circuit to stop a voltage discharge at a certain level. In particular embodiments, the discharge level may be programmable.

Still another particular advantage is provided in that the active power consumption of a device may be reduced by using the voltage swing adjustment circuit without introducing additional power supplies. In a particular illustrative embodiment, the voltage swing adjustment circuit may reduce power consumed by a device by as much as thirty-three percent (33%).

Other aspects, advantages, and features of the present disclosure will become apparent after review of the entire application, including the following sections: Brief Description of the Drawings, Detailed Description, and the Claims.

V. DETAILED DESCRIPTION

Figure 1:
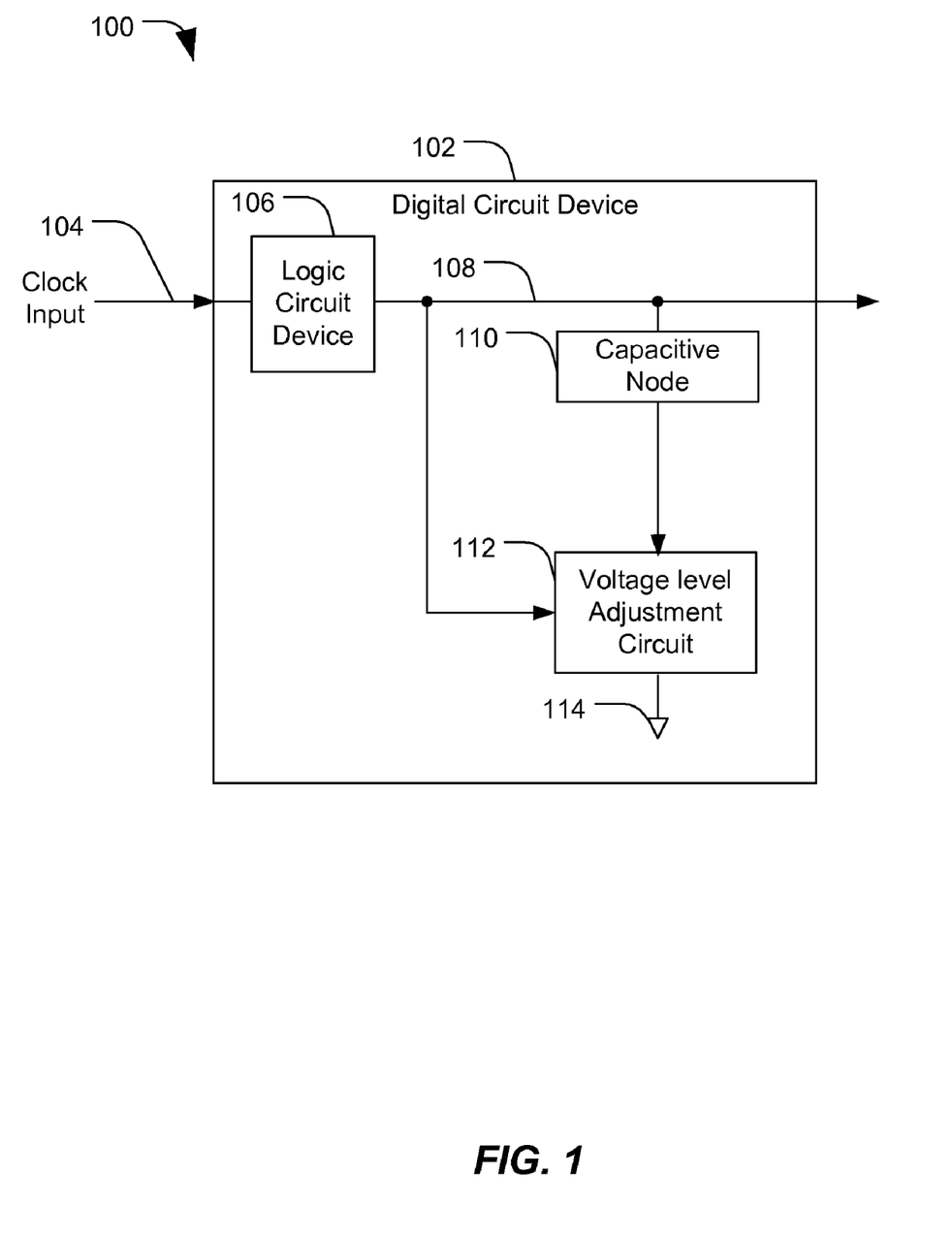
FIG. 1 is a block diagram of a particular illustrative embodiment of a system to control a voltage swing.

FIG. 1 is a block diagram of a particular illustrative embodiment of a system 100 to control a voltage swing. The system 100 includes a digital circuit device 102 that includes an input 104, which may be responsive to a signal, such as a clock signal. The digital circuit device 102 includes a logic circuit device 106 that is coupled to the input 104 and to a line 108. The digital circuit device 102 includes a capacitive node 110 that is coupled to the line 108 and to a voltage level adjustment circuit 112. The voltage level adjustment circuit 112 is coupled to the line 108, to the capacitive node 110, and to an electrical ground 114.

In a particular illustrative embodiment, a clock input may be received at the input 104 and may be provided to the line 108 via the logic circuit device 106. The voltage level adjustment circuit 112 is adapted to regulate a discharge path from the capacitive node 110 via the line 108 and to the electrical ground 114 to prevent the capacitive node 110 from discharging to a zero voltage level. In a particular illustrative embodiment, the term "regulate" as used herein refers to controlling, throttling or otherwise regulating current flow via the discharge path. In a particular illustrative embodiment, a method of regulation may reduce a rate of discharge of a capacitor or capacitive node. In another particular illustrative embodiment, the term "regulate" may refer to altering a low voltage level to prevent discharge of the capacitive node 110 to a ground voltage level. In another particular illustrative embodiment, the term "regulate" may refer to clamping a voltage level of a signal to a voltage range that is less than a voltage level of the voltage source and greater than a ground voltage level (i.e., a non-ground voltage level). By limiting the discharge of the capacitive node 110 to a non-ground voltage level (i.e., a voltage level that is greater than zero volts), the capacitive node 110 uses less power to recharge to a logic high voltage level. In addition, a voltage level of the line 108 may vary within a reduced voltage range. The line 108 may be coupled to another circuit to provide a clock signal having a reduced voltage swing or another signal to the circuit device. Within a larger circuit, the reduced voltage swing may result in a reduced overall power consumption, which may extend a life of a battery, may allow for reallocation of power resources to other processes, or any combination thereof.

In a particular illustrative embodiment, the dissipated energy consumed by a given net or chip can be estimated using the following equation:

$$E_{(dissp)} = C_{(Total)} \cdot Vdd \cdot V_{(swing)} \quad \text{(Equation 1)}$$

The dissipated energy ($E_{(dissp)}$) represents the dynamic energy consumed by the given net or chip, a total capacitance ($C_{(Total)}$) represents a capacitance that is charged or discharged when switching between logic zero (0) and logic one (1), $V_{DD}$ represents a pin voltage that supplies power for the circuit, and V(swing) represents a difference between the logic one (high) and logic zero (low) values. In general, the energy dissipated ($E_{(dissp)}$) by the given net or chip is proportional to the voltage swing ($V_{(swing)}$). Accordingly, by utilizing the voltage level adjustment circuit 112 to throttle the discharge of the capacitive node 110 when the clock signal is at a logic low level, the voltage swing of the digital circuit device 102 is reduced. Thus, the energy dissipated by the digital circuit device 102 is also reduced.

Figure 2:
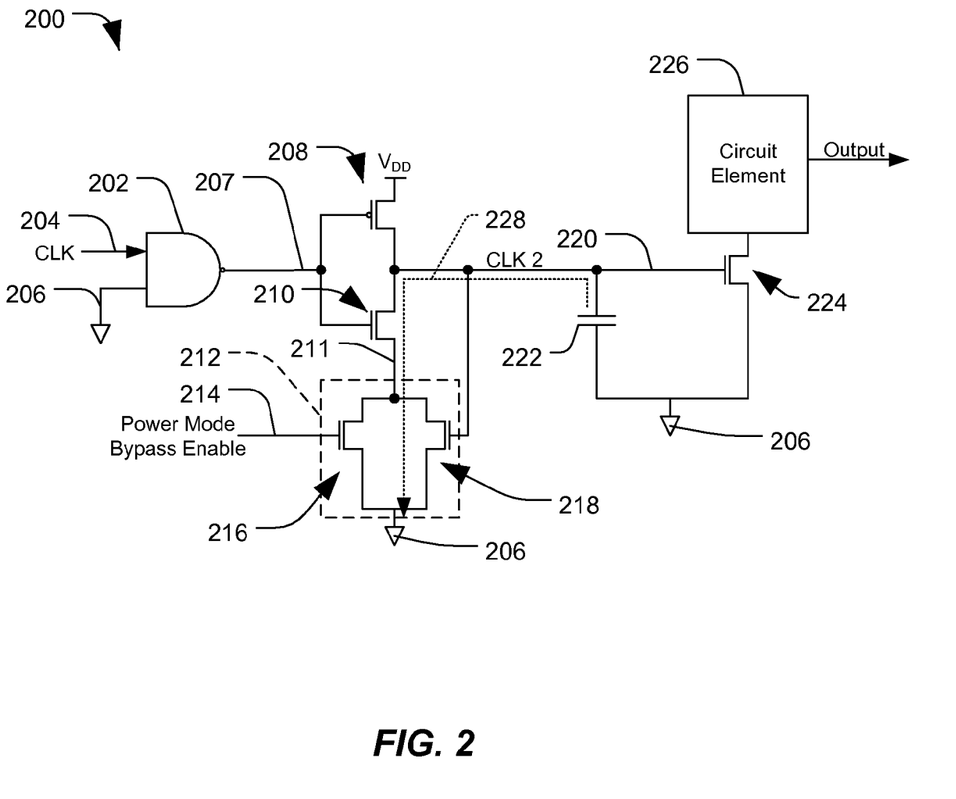
FIG. 2 is a circuit diagram of a second particular illustrative embodiment of a system to control a voltage swing.

FIG. 2 is a circuit diagram of a second particular illustrative embodiment of a system 200 to control a voltage swing. The system 200 includes a logic circuit element, such as a logic NAND gate 202, that has a first input 204 responsive to a signal source, such as a clock, to receive an input signal. The logic NAND gate 202 also includes a second input that is coupled to an electrical ground 206. The NAND gate 202 also has an output 207. The system also includes a p-channel transistor 208 and an n-channel transistor 210 arranged to form an inverter circuit. The p-channel transistor 208 includes a first terminal coupled to a power supply terminal ($V_{DD}$), a control terminal coupled to the output 207, and a second terminal coupled to a capacitive node 220. The n-channel transistor 210 includes a first terminal coupled to the capacitive node 220, a control terminal coupled to the output 207, and a second terminal coupled a node 211. A voltage level adjustment circuit 212 is coupled between a node 211 and the electrical ground 206.

The voltage level adjustment circuit 212 includes a pair of n-channel transistors 216 and 218 arranged in parallel. The n-channel transistor 216 includes a first terminal coupled to the node 211, a control terminal coupled to a power mode control bypass input 214, and a second node coupled to the electrical ground 206. The n-channel transistor 218 includes a first terminal coupled to the node 211, a control terminal coupled to the capacitive node 220, and a third terminal coupled to the electrical ground 206. The system 200 may include a capacitor 222 that is coupled between the capacitive node 220 and the electrical ground 206. In an alternative embodiment, the capacitor 222 may represent line capacitances of wire traces and switching capacitances associated with various circuit devices, such as the transistor 224. The transistor 224 may include a first terminal coupled to a circuit element 226, a control terminal coupled to the capacitive node 220, and a third terminal coupled to the electrical ground 206. In a particular illustrative embodiment, the circuit element 226 may be a receiver that is adapted to receive a data input and to provide an output.

In a particular illustrative embodiment, a clock input signal is received at the input 204. The clock input signal is inverted by the NAND gate 202 and provided as an inverted clock signal at the output 207. When the clock input signal at the input 204 is at a logic low level, the value at the output 207 is at a logic high level. The p-channel transistor 208 is turned off, and the n-channel transistor 210 is activated to pull down a voltage level at the node 220. When the clock input signal at the input 204 is at a logic high level, the value at the output 207 is at a logic low level. The n-channel transistor 210 is turned off and the p-channel transistor 208 is active. In this instance, the p-channel transistor 208 pulls up a voltage level at the node 220 to a logic high level.

In a particular illustrative embodiment, when the clock input signal at the input 204 is at a logic high level, the voltage level at the node 220 is also at a logic high level and the capacitor 222 is charged. When the clock input signal at the input 204 transitions to a logic low level, the voltage level at the node 220 also transitions. The capacitor 222 discharges via a discharge path 228, which includes the n-channel transistor 210, the voltage level adjustment circuit 212 and the electrical ground 206. In a particular illustrative embodiment, a power mode control signal may be applied to the power mode control enable input 214 to activate the transistor 216, providing a bypass path for current flow from the node 211 to the electrical ground 206. When the power mode control signal is not applied to activate the transistor 216, the transistor 218 may be activated and controlled based on a voltage level at the node 220. When the voltage level at the node 220 switches from the logic high voltage level to a logic low voltage level, the n-channel transistor 210 turns on (since a voltage level at the node 207 is at a logic high voltage level) and the capacitor 222 discharges via the discharge path 228.

In a particular illustrative embodiment, the discharging voltage from the capacitor 222 initially activates the transistor 218 to couple the node 211 to the electrical ground 206. As the capacitor 222 discharges, the voltage level of the node 220 decreases and current flow through the transistor 218 is reduced because a voltage level at the control terminal of the transistor 218 is reduced, until the voltage level at the control terminal of the transistor 218 is approximately equal to a threshold voltage of the transistor 218. At this point, the transistor 218 turns off and the voltage level at the node 220 is held at a voltage level that is greater than a voltage level of the electrical ground 206. In this manner, the capacitor 222 is prevented from completely discharging to a ground voltage level. Thus, the voltage swing of the capacitive node 220 can be reduced by increasing a logic low or discharge voltage level.

In a particular illustrative embodiment, a clock signal is received at the input 204 and is provided to the capacitive node 220. The voltage level adjustment circuit 212 throttles a discharge path of the capacitive node 220 to provide a reduced capacitive discharge from the capacitor 222, providing a second clock signal (CLK 2) at the node 220. The second clock signal (CLK 2) at the node 220 is a reduced version of the clock signal at the input 204. In a particular illustrative embodiment, the term "reduced clock signal" refers to a second clock signal that has a smaller voltage swing than a clock signal at the input 204. The second or reduced clock signal (CLK 2) at the node 220 may be provided to the circuit element 226. By providing a reduced version or second clock signal (CLK 2) to the circuit element 226, power consumption by the circuit element 226 may be reduced.

In a particular illustrative embodiment, the swing of the clock input signal may range from a first voltage level ($V_{DD}$) to a ground voltage level, for example. In contrast, the reduced clock signal (CLK 2) may range from the first voltage level ($V_{DD}$) to a second voltage level that is greater than the ground voltage level. In a particular embodiment, the second voltage level may be approximately a threshold voltage level ($V_T$) above the ground voltage level, where the threshold voltage level is determined by the device characteristics of the transistor 218.

Figure 3:
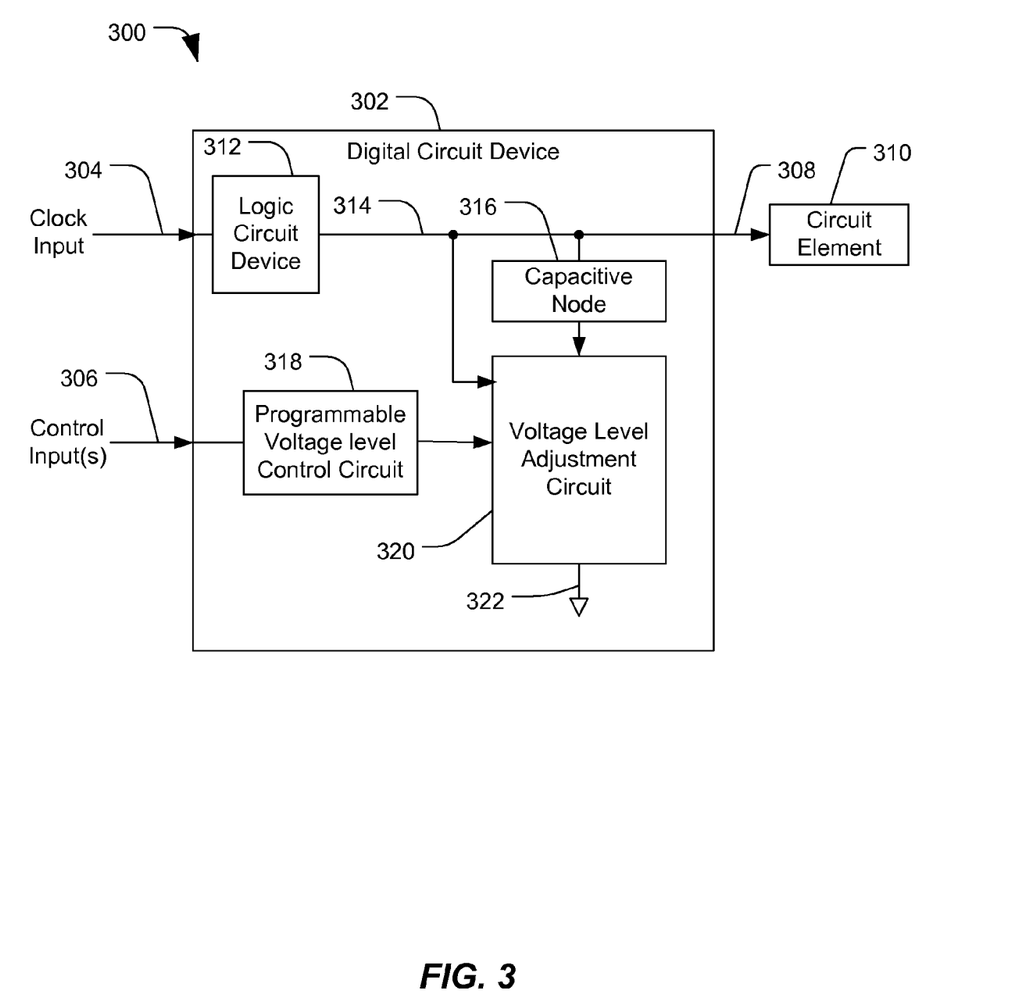
FIG. 3 is a block diagram of a third particular illustrative embodiment of a system to control a voltage swing.

FIG. 3 is a block diagram of a third particular illustrative embodiment of a system 300 to control a voltage swing. The system 300 includes a digital circuit device 302 that includes an input 304, which may be responsive to a signal, such as a clock signal. The digital circuit device 302 includes a logic circuit device 312 that is coupled to the input 304 and to a line 314. The digital circuit device 302 includes a capacitive node 316 that is coupled to the line 314 and to a voltage level adjustment circuit 320. The voltage level adjustment circuit 320 is coupled to the line 314, to the capacitive node 316, and to an electrical ground 322. The digital circuit device 302 also includes a programmable voltage level control circuit 318 and one or more control inputs 306 to receive one or more control input signals. The programmable voltage level control circuit 318 is coupled to the voltage level adjustment circuit 320.

In a particular illustrative embodiment, a clock input may be received at the input 304 and may be provided to the line 314 via the logic circuit device 312. The voltage level adjustment circuit 320 is adapted to regulate a discharge path from the capacitive node 316 via the line 314 and to the electrical ground 322 to prevent the capacitive node 316 from discharging to a zero voltage level when the clock signal is at a logic low voltage level. In a particular illustrative embodiment, one or more control input signals may be applied to the one or more control inputs 306 to control the programmable voltage level control circuit 318 to adjust a voltage level of the voltage level adjustment circuit 320. The programmable voltage level adjustment control circuit 318 may be adapted to regulate (i.e., throttle, restrict or otherwise control) current flow via the discharge path from the capacitive node 316 to the electrical ground 322. In a particular illustrative embodiment, a first control signal may be received via the one or more control inputs 306 to control the programmable voltage level control circuit 318 to increase a baseline voltage level of the capacitive discharge path to a first voltage level by controlling the voltage level adjustment circuit 320, such that the capacitive node 316 discharges to the first voltage level instead of to a ground voltage level. In another particular illustrative embodiment, a second control signal may be received via the one or ore control inputs 306 to control the programmable voltage level control circuit 318 to adjust the voltage level adjustment circuit 320 to increase the baseline voltage level of the capacitive discharge path to a second voltage level, such that the capacitive node 316 discharges to the second voltage level instead of to a ground voltage level. In another particular illustrative embodiment, the programmable voltage level control circuit 318 may aggregate one or more control signals received via the one or more control inputs 306. The programmable voltage level control circuit 318 may control the voltage level adjustment circuit 320 to throttle the discharge path to allow the capacitive node 316 to discharge to a desired voltage level.

In a particular illustrative embodiment, by limiting the discharge of the capacitive node 316 to a non-ground voltage level (i.e., a voltage level that is greater than zero volts), the capacitive node 316 retains a portion of its charge and consequently uses less power to recharge to a logic high voltage level. Within a larger circuit, the reduced voltage swing may result in a reduced overall power consumption, which may extend a life of a battery, may allow for reallocation of power resources to other processes, or any combination thereof.

Figure 4:
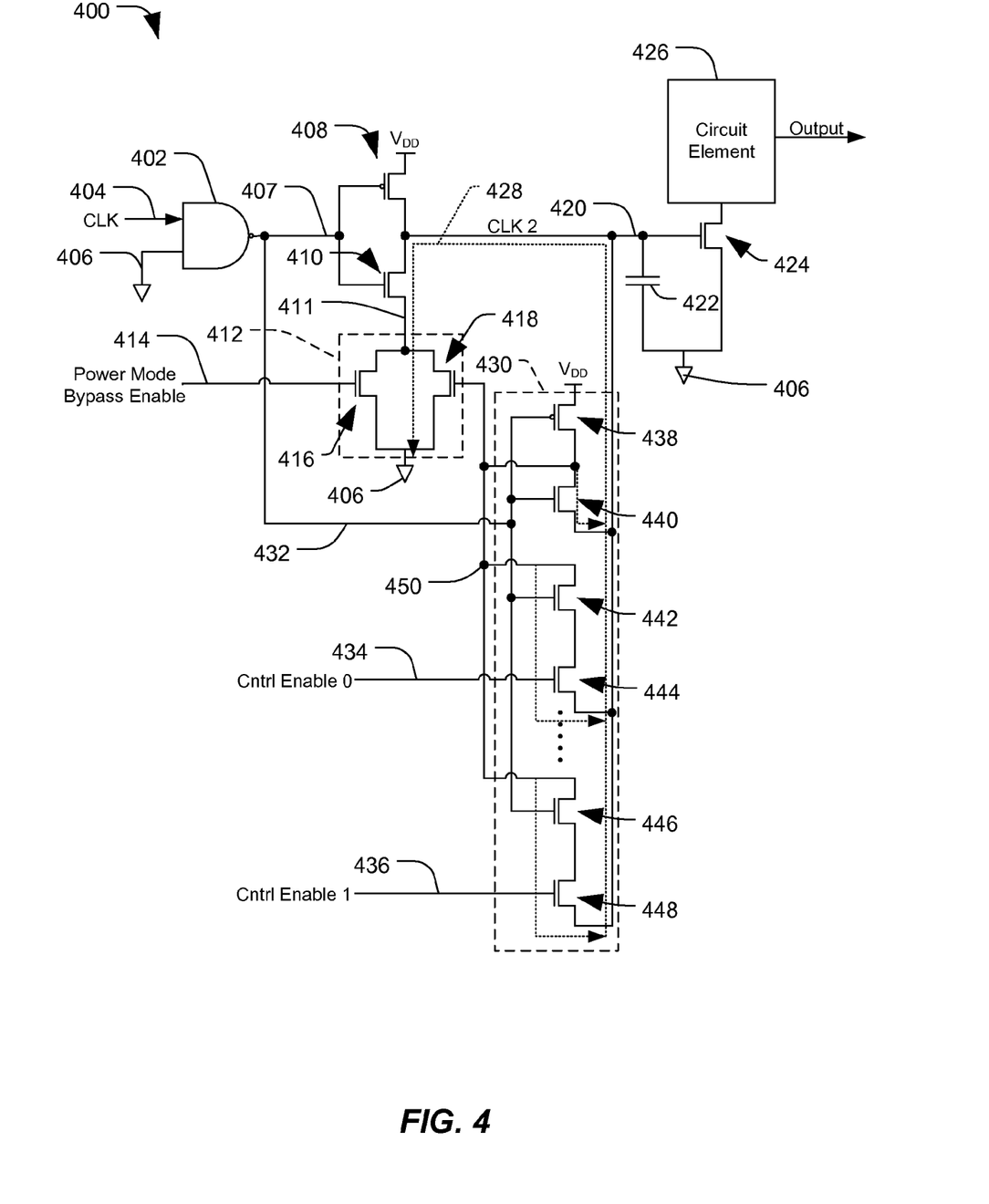
FIG. 4 is a circuit diagram of a fourth particular illustrative embodiment of a system to control a voltage swing.

FIG. 4 is a circuit diagram of a fourth particular illustrative embodiment of the system 400 to control a voltage swing. The system 400 includes a logic circuit element, such as a logic NAND gate 402, that includes a first input 404 to receive an input signal, such as a clock signal. The logic circuit element 402 also includes a second input that is coupled to an electrical ground 406. Since the second input is held at a logic low voltage level (i.e., a ground voltage level), the output of the logic NAND gate 402 at a node 407 represents an inverted version of the input signal at the first input 402.

The system 400 also includes a p-channel transistor 408 and an n-channel transistor 410 arranged to form an inverter circuit. The p-channel transistor 408 includes a first terminal coupled to a voltage supply ($V_{DD}$), a control terminal coupled to the node 407, and a second terminal coupled to a capacitive node 420. The n-channel transistor 410 includes a first terminal coupled to the capacitive node 420, a control terminal coupled to the node 407, and a second terminal coupled to a node 411. The system 400 further includes a voltage level adjustment circuit 412 that is coupled between the node 411 and the electrical ground 406. In a particular illustrative embodiment, the voltage level adjustment circuit 412 may be an embodiment of the voltage level adjustment circuit 320 illustrated in FIG. 3. The voltage level adjustment circuit 412 includes a transistor 416 and a transistor 418 arranged in parallel between the node 411 and the electrical ground 406.

The transistor 416 includes a first terminal coupled to the node 411, a control terminal coupled to a power mode bypass input 414, and a second terminal coupled to the electrical ground 406. When a power mode bypass signal is applied to the power mode bypass input 414, the voltage level adjustment circuit 412 provides a discharge path from the node 411 to the electrical ground 406. The transistor 418 includes a first terminal coupled to the node 411, a control terminal coupled to a node 450 that is responsive to a programmable voltage level control circuit 430, and a second terminal coupled to the electrical ground 406. In a particular illustrative embodiment, the programmable voltage level control circuit 430 may be an embodiment of the programmable voltage level control circuit 318 illustrated in FIG. 3.

The programmable voltage level control circuit 430 includes multiple transistor pairs. The programmable voltage level control circuit 430 includes a p-channel transistor 438 and n-channel transistors 440, 442, 444, 446, and 448. The p-channel transistor 438 and the n-channel transistor 440 represent a transistor pair. Additionally, the n-channel transistors 440 and 442 and the n-channel transistors 446 and 448 represent transistor pairs. The p-channel transistor 438 includes a first terminal coupled to the power supply ($V_{DD}$), a control terminal coupled to the node 407 by the line 432, and a second terminal coupled to the node 450. The n-channel transistor 440 includes a first terminal coupled to the node 450, a control terminal coupled to the node 407 via the line 432, and a second terminal coupled to the capacitive node 420. The n-channel transistor 442 includes a third terminal coupled to the node 450, a control terminal coupled to the node 407 via the line 432, and a fifth terminal. The n-channel transistor 444 includes a sixth terminal coupled to the fifth terminal, a control terminal coupled to a first control enable input 434 to receive a control enable (0) signal, and a seventh terminal coupled to the capacitive node 420. The n-channel transistor 446 includes an eighth terminal coupled to the node 450, a control terminal coupled to the node 407 via the line 432, and a ninth terminal. The n-channel transistor 448 includes a tenth terminal coupled to the ninth terminal, a control terminal coupled to a second control enable input 436 to receive a second control enable (1) signal, and an eleventh terminal coupled to the capacitive node 420. It should be understood that the programmable voltage level control circuit 430 may include additional transistors, such as the transistors 442, 444, 446 and 444 and additional control inputs, such as the control inputs 434 and 436 to provide additional control and additional voltage levels.

The system 400 further includes a capacitor 422 coupled between the capacitive node 420 and the electrical ground 406. In a particular illustrative embodiment, instead of being a discrete circuit component, the capacitor 422 may represent line capacitances and gate capacitances of the circuit device. The system 400 also includes a transistor 424 including a first terminal coupled to a circuit element 426, a control terminal coupled to the capacitive node 420, and a second terminal coupled to the electrical ground 406. The circuit element 426 may be a circuit adapted to receive a clock signal, such as a receiver, a transmitter, another circuit, or any combination thereof.

In a particular illustrative embodiment, the programmable voltage level control circuit 430 may receive a control enable signal via the control enable input 434, which activates the transistor 444 to couple the transistor 442 between the node 450 and the capacitive node 420. If the voltage level at the node 407 switches from low to high, the voltage level of the capacitive node 420 switches from high to low. The capacitor 422 discharges via the discharge path 428. The voltage level at the node 407 when it reaches a logic high voltage level, turns on the transistors 440, 442 and 446. The transistor 448 is not enabled, so the transistor 446 does not pass current. The transistor 444 is turned on by the control enable signal at the control enable input 434, and the transistor 442 passes current via the transistor 444 to the capacitive node 420. The transistors 440, 442 and 444 cooperate to pull down a voltage level of the node 450, thereby turning off the transistor 418 to prevent complete discharge of the capacitor 422 via the discharge path 428. In a particular illustrative embodiment, transistors 440, 442, 444, 446, and 448 are coupled to the capacitive node 420 to provide a current feedback loop that operates to regulate the current flow through the transistor 418 to prevent complete discharge of the capacitor 420.

In a particular illustrative embodiment, the node 450 is isolated from the input 404. When the input signal applied to the input 404 is a clock signal, the node 450 is kept at a voltage level, such as the voltage level of the voltage source ($V_{DD}$) until the level of the clock signal (CLK 2) at the node 420 falls to a voltage level that is at least one voltage threshold below the voltage level of the voltage source ($V_{DD}$). When this voltage level is reached, the programmable voltage level control circuit 430 enables a sharp pulldown transition at the capacitive node 420.

Figure 5A:
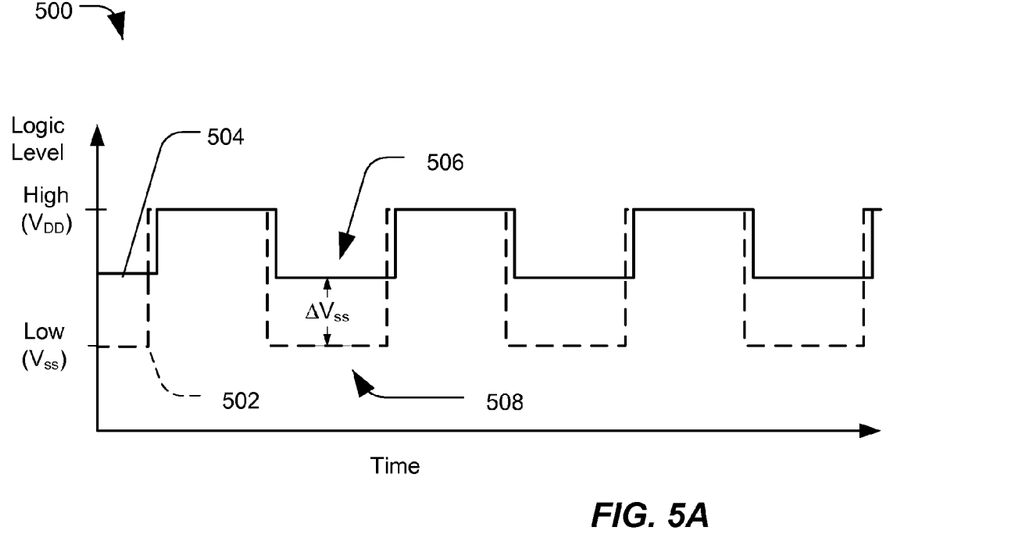
FIGS. 5A and 5B are graphical representations of clock signals and adjusted clock signals having a reduced voltage swing implemented using the systems of FIGS. 1-4.
Figure 5B:
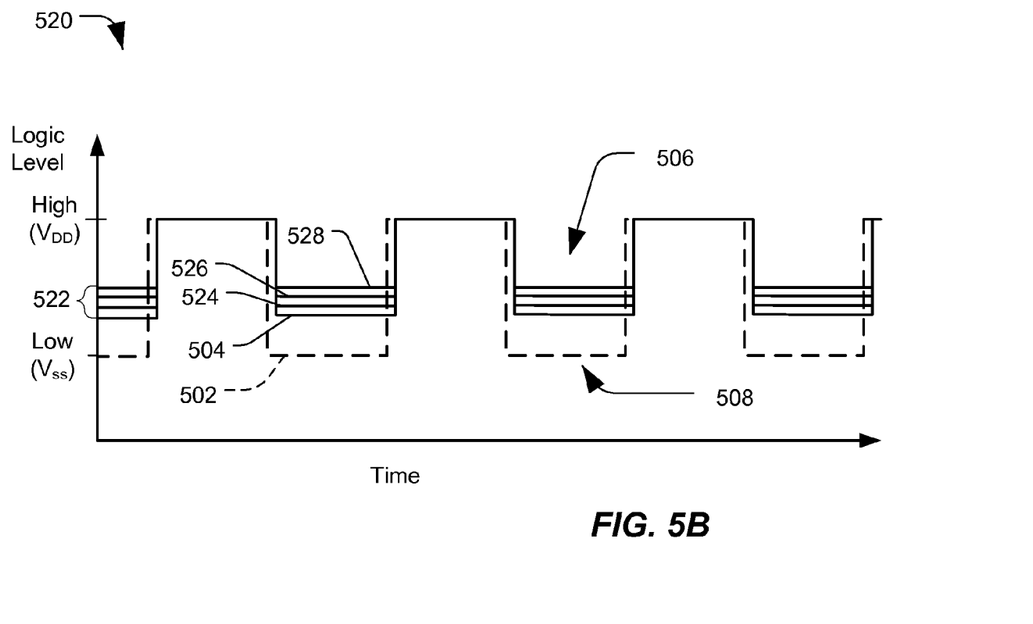

FIGS. 5A and 5B are graphical representations of clock signals and adjusted clock signals having a reduced voltage swing implemented using systems of FIGS. 1-4. FIG. 5A is a graphical representation 500 illustrating a clock signal 502 (shown as a dashed line) that has a voltage swing between a logic low voltage level ($V_{SS}$) and a logic high voltage level ($V_{DD}$). The graphical representation 500 also includes a reduced swing clock signal (i.e., a second clock, CLK 2) 504. The clock signal 502 may be a signal that is received, for example, at one of the inputs 104, 204, 304, or 404 illustrated in FIGS. 1-4, respectively. The reduced swing clock signal 504 represents a corresponding signal at the line 108 in FIG. 1, at the node 220 in FIG. 2, at the line 314 in FIG. 3, or at the node 420 in FIG. 4. The reduced swing clock signal 504 has a low portion 506 that corresponds to a low portion 508 of the clock signal 502, but the voltage level of the low portion 506 and the low portion 508 have a voltage differential ($\Delta V_{SS}$), which represents a difference between a logic low voltage level and a first voltage level, for example.

FIG. 5B is a graphical representation 520 illustrating a clock signal 502 (shown as a dashed line) that has a voltage swing between a logic low voltage level ($V_{SS}$) and a logic high voltage level ($V_{DD}$). The clock signal 502 may be a signal that is received, for example, at one of the inputs 104, 204, 304, or 404 illustrated in FIGS. 1-4, respectively. The graphical representation 520 also includes a first reduced swing clock signal 504, a second reduced clock signal 524, a third reduced clock signal 526, and a fourth reduced clock signal 528. The first, second third and fourth reduced swing clock signals 504, 524, 526 and 528 may represent various voltage levels or tiers (generally indicated at 522), which may be selected by applying control signals to control inputs 434 and 436 of the programmable voltage control circuit 430 illustrated in FIG. 4, for example. The first, second, third and fourth reduced swing clock signals 504, 524, 526, and 528 represent corresponding signals that appears at the line 108 in FIG. 1, at the node 220 in FIG. 2, at the line 314 in FIG. 3, or at the node 420 in FIG. 4. For example, the first, second, third, and fourth reduced clock signals 504, 524, 526, and 528 may be generated by controlling the voltage level adjusting circuits 320 and 412 illustrated in FIGS. 3 and 4, respectively, using the programmable voltage level control circuit 318 illustrated in FIG. 3 or the programmable voltage level control circuit 430 in FIG. 4, respectively. In a particular illustrative embodiment, the third reduced clock signal 526 illustrates a second clock (CLK 2) at node 420 in FIG. 4, when the two control enable inputs are received at the programmable voltage level control circuit 430 via the control enable inputs 434 and 436 illustrated in FIG. 4.

Figure 6:
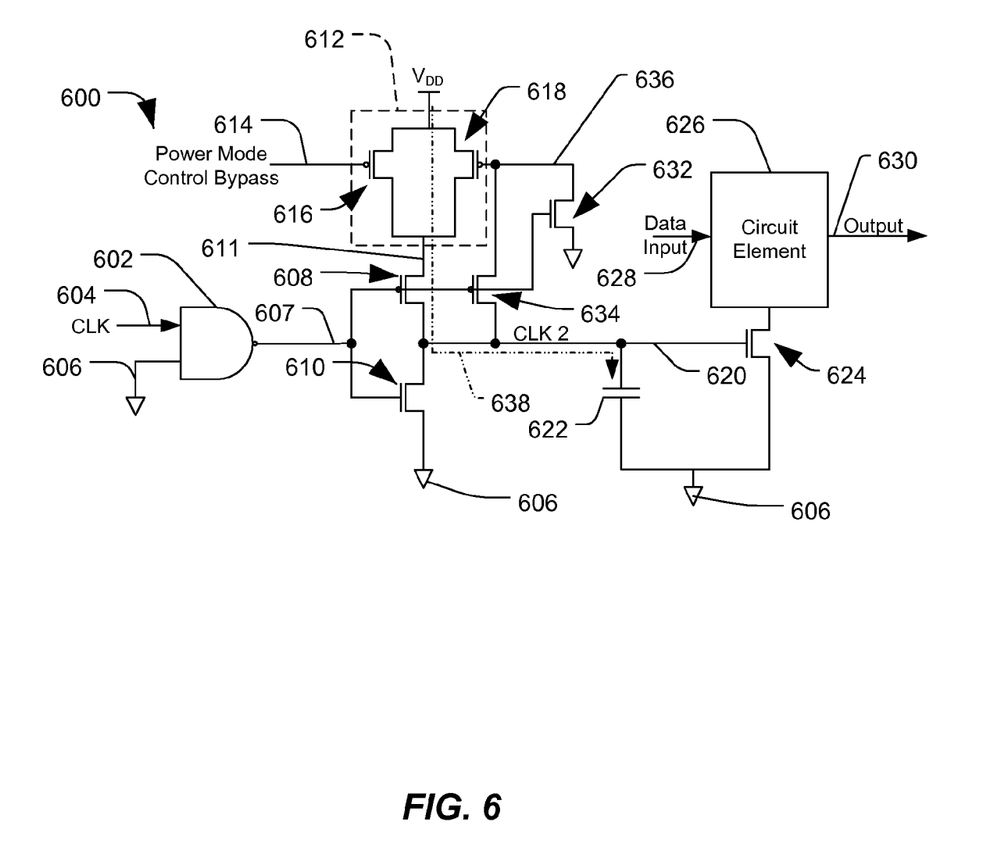
FIG. 6 is a block diagram of a fifth particular illustrative embodiment of a system to control a voltage swing.

FIG. 6 is a block diagram of a fifth particular illustrative embodiment of a system 600 to control a voltage swing. The system 600 includes a logic circuit element, such as a logic NAND gate 602, that includes a first input 604 to receive an input signal, such as a clock signal. The logic circuit element 602 also includes a second input that is coupled to an electrical ground 606. Since the second input is held at a logic low voltage level (i.e., a ground voltage level), the output of the logic NAND gate 602 at a node 607 represents an inverted version of the input signal at the first input 604.

The system 600 includes a p-channel transistor 608 and a n-channel transistor 610 arranged to form an inverter circuit. The p-channel transistor 608 includes a first terminal coupled to a node 611, a control terminal coupled to the node 607, and a second terminal coupled to a capacitive node 620. The n-channel transistor 610 includes a first terminal coupled to the capacitive node 620, a control terminal coupled to the node 607, and a second terminal coupled to the electrical ground 606. The system 600 also includes a voltage level adjustment circuit 612 that has a transistor 616 and a transistor 618 arranged in parallel between a voltage source ($V_{DD}$) and the node 611. The transistor 616 includes a first terminal coupled to the voltage source ($V_{DD}$), a control terminal coupled to a power mode bypass enable input 614, and a second terminal coupled to the node 611. When a power mode bypass enable signal is received at the power mode bypass enable input 614, the transistor 616 couples the node 611 to the voltage source ($V_{DD}$). The transistor 618 includes a first terminal coupled to the voltage source ($V_{DD}$), a control terminal coupled to a node 636, and a second terminal coupled to the node 611.

The system 600 also includes a transistor 634 having a first terminal coupled to the node 636, a control terminal coupled to the node 607, and a second terminal coupled to the capacitive node 620. The system 600 further includes a transistor 632 including a first terminal coupled to the node 636, a control terminal coupled to the node 607, and a second terminal coupled to the electrical ground 606. Additionally, the system 600 includes a capacitor 622 coupled between the capacitive node 620 and the electrical ground 606. The system 600 also includes a transistor 624 including a first terminal coupled to a circuit element 626, a control terminal coupled to the capacitive node, and a second terminal coupled to the electrical ground 606. The circuit element 626 may include a data input 628 and an output 630. In a particular illustrative embodiment, the circuit element 626 may be a receiver, a transmitter, a processor, another circuit element, or any combination thereof.

In a particular illustrative embodiment, when a clock signal at the input 604 transitions from a logic low to a logic high voltage level, the voltage level at the node 607 transitions from a logic high to a logic low voltage level, activating the transistors 608 and 634 and turning off the transistor 632. The capacitive node 620 may be electrically coupled to the voltage supply ($V_{DD}$) via a charge path illustrated by a line 638. A voltage level of the capacitive node 620 charges to a first voltage level that is less than the level of the voltage source ($V_{DD}$), because the transistor 632 passes less current in response to the rising voltage at the capacitive node 620. Thus, a voltage at the node 636 increases, restricting or regulating current flow through the transistor 618 to the capacitive node 620. When the clock signal at the input 604 switches from high to low, the voltage level at the node 607 transitions from low to high, turning off the transistors 608 and 634 and activating the transistor 632 to pull down a voltage level at the node 636. Since the transistor 608 is turned off, current does not flow to the capacitive node 620.

In a particular illustrative embodiment, the voltage level adjustment circuit 612 may be utilized to reduce a logic high portion of the signal at the capacitive node 620 to a first voltage level that is less than the voltage level of the voltage source ($V_{DD}$). Thus, for a clock signal at the input 604, the second clock signal (CLK 2) at the capacitive node 620 may swing between a logic low voltage level (i.e. a ground voltage level) and the first voltage level. The reduced voltage swing clock signal (i.e., CLK 2) may be provided as a clock signal to other circuit devices, such as the circuit element 626. By reducing the swing of the clock signal, overall power consumption of the circuit may be reduced.

Figure 7:
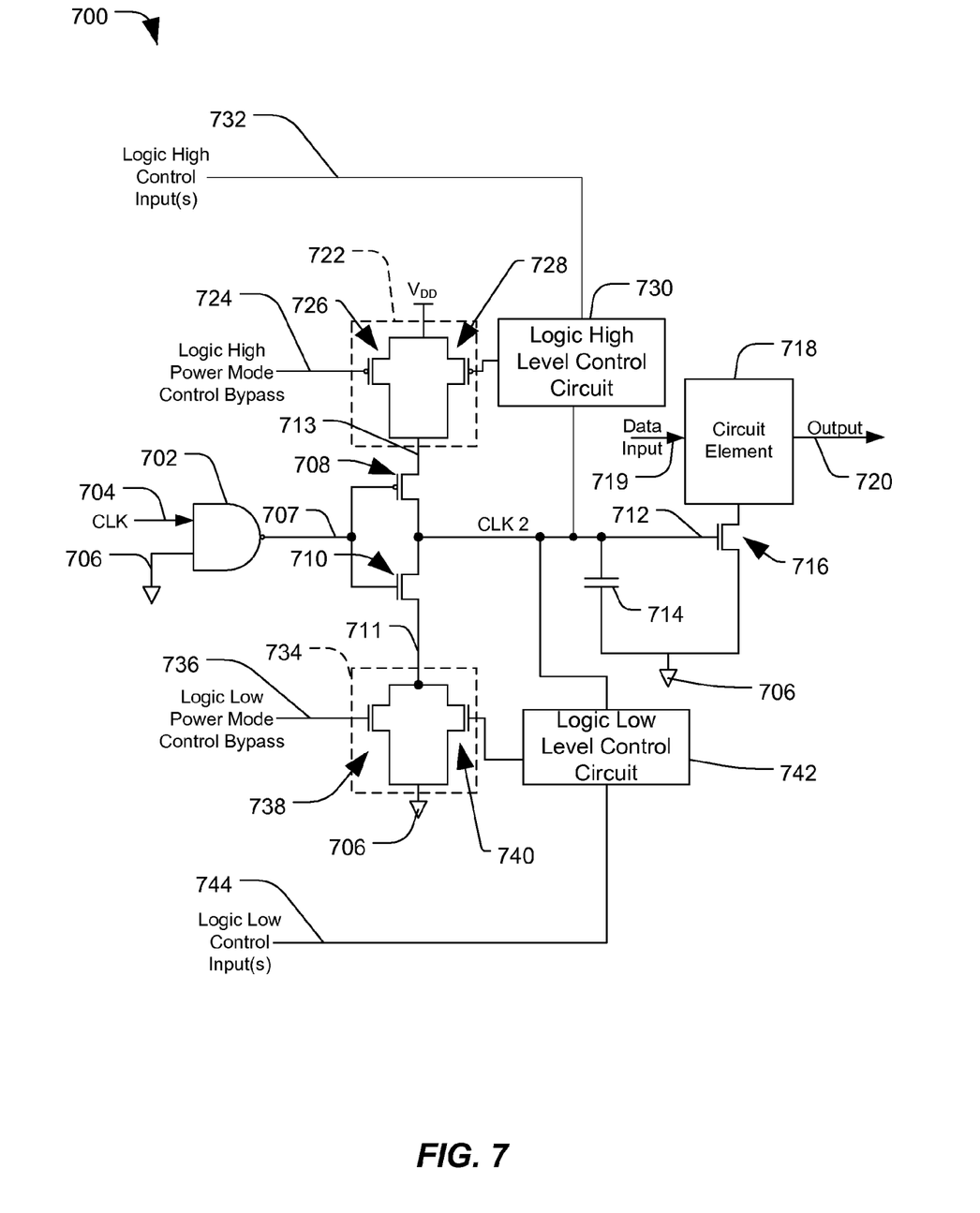
FIG. 7 is a block diagram of a sixth particular illustrative embodiment of a system to control a voltage swing.

FIG. 7 is a block diagram of a sixth particular illustrative embodiment of a system 700 to control a voltage swing. The system 700 includes a circuit element, such as a logic NAND gate 702 including a first input 704 to receive a signal, such as a clock signal. The logic NAND gate 702 also includes a second input coupled to an electrical ground 706. Since the second input to the logic NAND gate 702 is held at a voltage low level, the output of the logic NAND gate 702 at a capacitive node 707 represents an inverted version of the input signal at the first input 704.

The system 700 includes a p-channel transistor 708 and a n-channel transistor 710 arranged to form an inverter circuit. The p-channel transistor 708 includes a first terminal coupled to a node 713, a control terminal coupled to the capacitive node 707, and a second terminal coupled to a capacitive node 712. The n-channel transistor 710 includes a first terminal coupled to the capacitive node 712, a control terminal coupled to the capacitive node 707, and a second terminal coupled to a node 711. The system 700 includes a logic high voltage level adjustment circuit 722 coupled between the node 713 and a voltage source ($V_{DD}$) and includes a logic low voltage level adjustment circuit 734 coupled between the node 711 and an electrical ground 706. The system 700 includes a capacitor 714 coupled between the capacitive node 712 and the electrical ground 706. The system 700 also includes a transistor 716 having a first terminal coupled to a circuit element 718, a control terminal coupled to the capacitive node 712, and a second terminal coupled to the electrical ground 706. In a particular illustrative embodiment, the circuit element 718 may be a receiver circuit, a transmitter circuit, another circuit element that receives a reduced voltage swing signal via the capacitive node 712, or any combination thereof. The circuit element 718 may include a data input 719 and an output 720.

The logic high voltage level adjustment circuit 722 includes a first transistor 726 and a second transistor 728 coupled in parallel between the voltage source ($V_{DD}$) and the node 713. The first transistor 726 includes a first terminal coupled to the voltage source ($V_{DD}$), a control terminal coupled to a log high power mode control bypass terminal 724 to receive a logic high power mode control bypass signal, which enables the system 700 to bypass the logic high voltage level adjustment circuit 722. The transistor 728 includes a first terminal coupled to the voltage supply ($V_{DD}$), a control terminal coupled to a logic high level control circuit 730, and a third terminal coupled to the node 713. The logic high level control circuit 730 may be coupled to the capacitive node 712 and may include one or more control inputs 732 to receive one or more control input signals to adjust a logic high voltage level for the system 700. In a particular illustrative embodiment, the logic high level control circuit 730 is adapted to reduce the logic high voltage level to a first logic high voltage level based on the logic high control input signals.

The logic low voltage level adjustment circuit 734 includes a first transistor 738 and a second transistor 740 arranged in parallel between the node 711 and the electrical ground 706. The first transistor 738 includes a first terminal coupled to the node 711, a control terminal coupled to a bypass input 736 to receive a logic low power mode control bypass signal, and a second terminal coupled to the electrical ground. The second transistor 740 includes a first terminal coupled to the node 711, a control terminal coupled to a logic low level control circuit 742, and a second terminal coupled to the electrical ground 706. When a logic low power mode control bypass signal is applied to the bypass input 736, the logic low voltage level adjustment circuit 734 is bypassed to electrically couple the node 711 to the electrical ground 706. The logic low level control circuit 742 is coupled to the capacitive node 712 and includes one or more control inputs 744 to receive one or more logic low control signals, which control the logic low level control circuit 742 to adjust a logic low voltage level of the logic low voltage level adjustment circuit 734.

In a particular illustrative embodiment, the logic high voltage level adjustment circuit 722 and the logic low voltage level adjustment circuit 734 cooperate to clamp a voltage swing of a signal at the node 712 between a high voltage level that is less than the supply voltage ($V_{DD}$) and a low voltage level that is greater than a ground voltage (i.e., electrical ground 706). Additionally, the logic high level control circuit 730 and the logic low level control circuit 742 may be implemented using transistors. The logic high level control circuit 730 and the logic low level control circuit 742 may be controlled by the one or more control input signals via the logic high control inputs 732 and the logic low control inputs 744 to reduce the high voltage level and to increase the low voltage level to tune the voltage swing at the node 712.

Figure 8A:
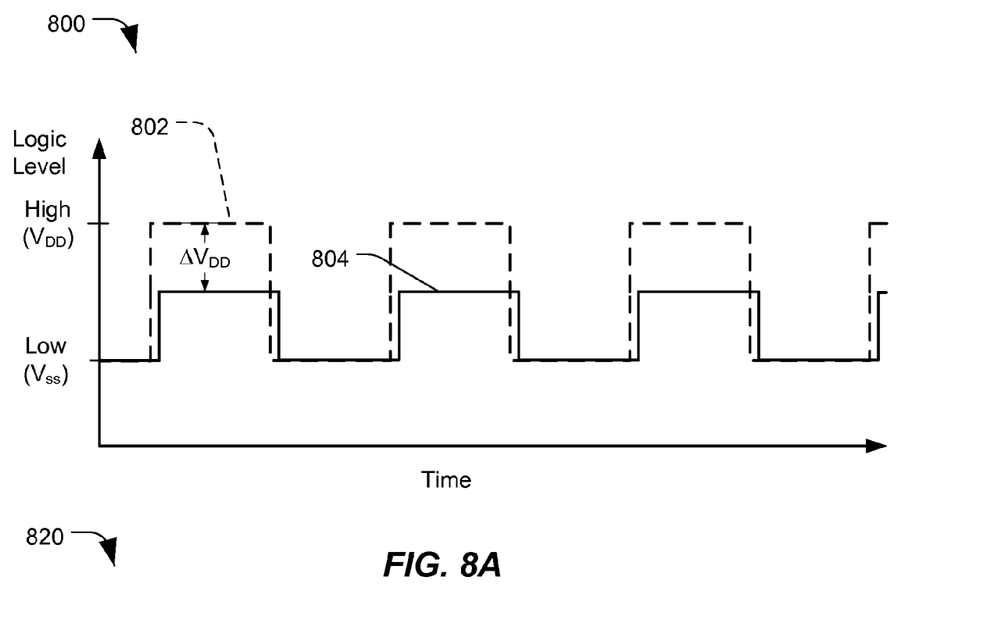
FIGS. 8A and 8B are graphical representations of clock signals and adjusted clock signals having a reduced voltage swing implemented using the systems of FIGS. 6 and 7.
Figure 8B:
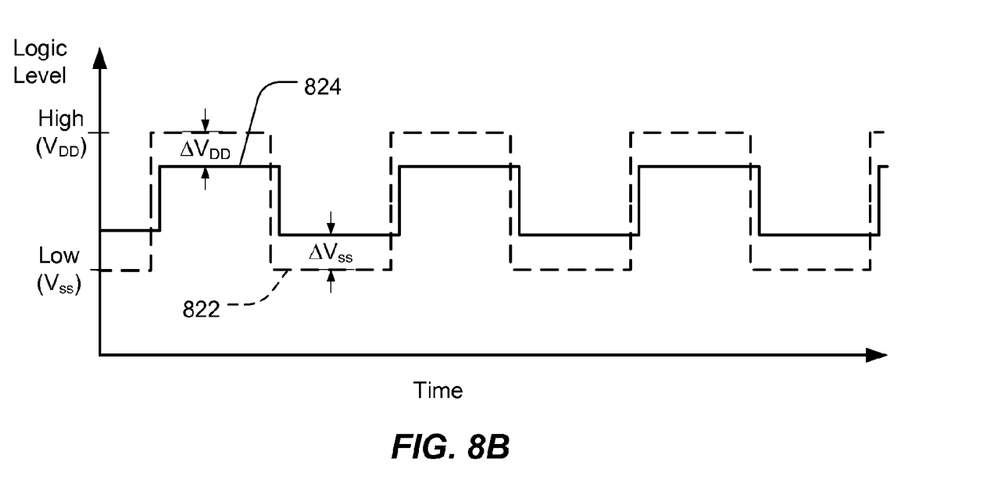

FIGS. 8A and 8B are graphical representations of clock signals and adjusted clock signals having a reduced voltage swing implemented using systems of FIGS. 6 and 7. FIG. 8A is a graphical representation 800 illustrating a clock signal 802 having a voltage swing from a low voltage level ($V_{SS}$) to a high voltage level ($V_{DD}$). In this instance, a logic high voltage level adjustment circuit, such as the voltage level adjustment circuit 612 illustrated in FIG. 6, may reduce a logic high portion of the clock signal 802 to a reduced clock signal 804 (i.e., a second clock signal, CLK 2). The difference between the logic high portion of the clock signal 802 and the reduced clock signal 804 is a differential voltage ($\Delta V_{DD}$). By using the reduced clock signal 804 to provide a clock signal to various circuit components, the overall power consumption of a circuit device.

FIG. 8B is a graphical representation 820 illustrating a clock signal 802 having a voltage swing from a low voltage level ($V_{SS}$) to a high voltage level ($V_{DD}$). In this instance, a logic high voltage level adjustment circuit and a logic low voltage level adjustment circuit, such as the voltage level adjustment circuits 722 and 734 illustrated in FIG. 7, may cooperate to produce a second clock signal having a reduced voltage swing, such as the reduced clock signal 824. In this instance, the reduced clock signal 824 varies from the input clock signal 802 at both the logic low and the logic high portions of the signal. The differential logic high voltage ($V_{DD}$) and the differential logic low voltage ($V_{SS}$) represent reductions in the clock voltage swing, which may result in reduced power consumption for the circuit.

Figure 9:
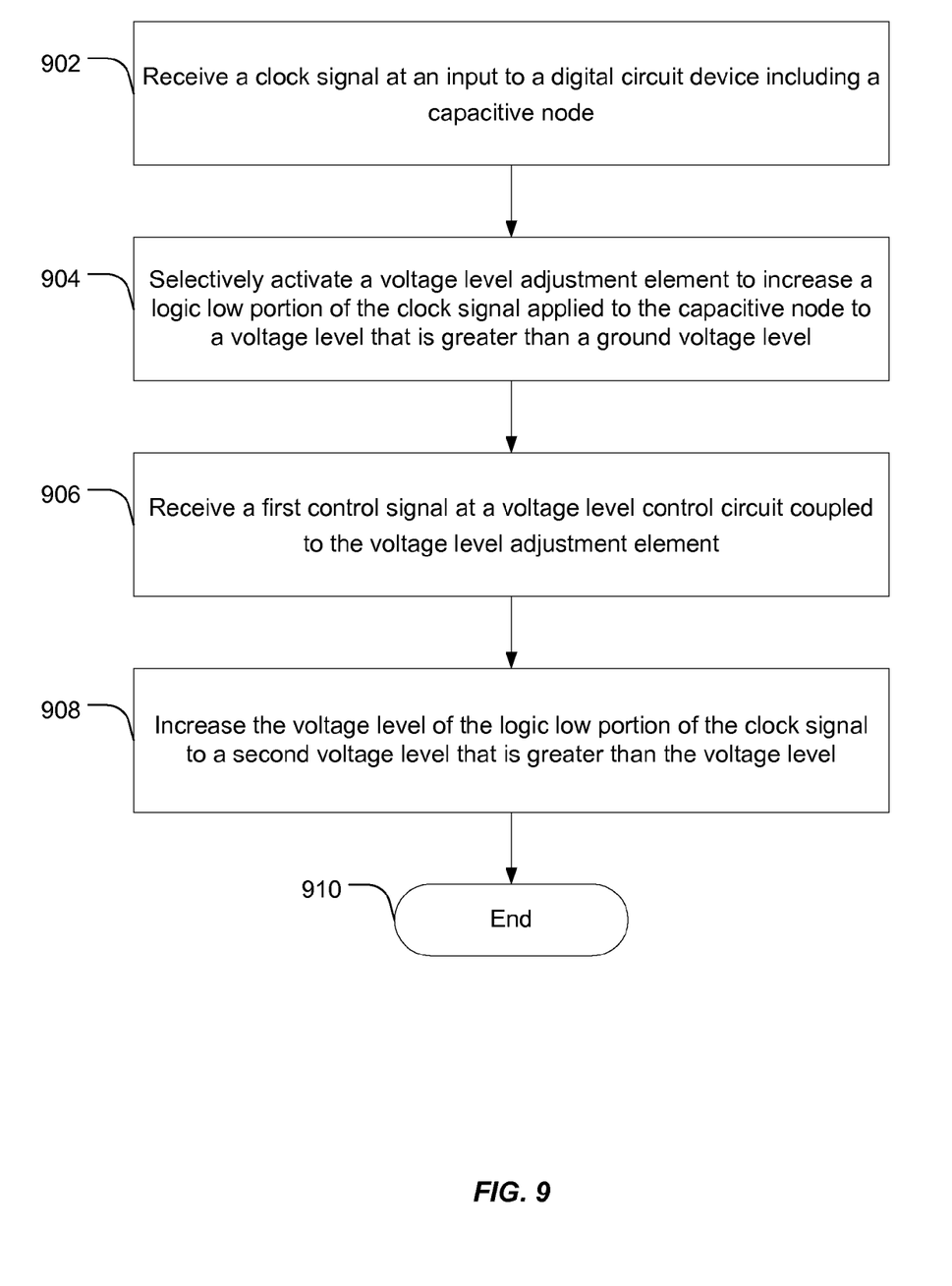
FIG. 9 is a flow diagram of a particular illustrative embodiment of a method of controlling a voltage swing.

FIG. 9 is a flow diagram of a particular illustrative embodiment of a method of controlling a voltage swing. At 902, a clock signal is received at an input to a digital circuit device that includes a capacitive node. Advancing to 904, a voltage level adjustment circuit is selectively activated to increase a logic low portion of the clock signal applied to the capacitive node to a voltage level that is greater than a ground voltage level. Moving to 906, a first control signal is received at a voltage level control circuit coupled to the voltage level adjustment circuit. Proceeding to 908, the voltage level of the logic low portion of the clock signal is increased to a second voltage level that is greater than the voltage level. The method terminates at 910.

In general, the voltage level adjustment circuit may be adjustable. In a particular illustrative embodiment, the voltage level adjustment circuit may be coupled to a programmable voltage level control circuit, which may receive one or more control signals to regulate current flow through the voltage level adjustment circuit. By regulating the current flow, the voltage level adjustment circuit prevents a capacitive node from discharging to a ground voltage, prevents the capacitive node from charging to a voltage level of a voltage source ($V_{DD}$), or both. Thus, a voltage swing of the signal at the capacitive node is clamped to reduce the voltage swing and thereby to reduce power consumption. Additionally, since the capacitor need not recharge to the level of the voltage source ($V_{DD}$) nor discharge to the ground voltage level ($V_{SS}$), the capacitor may switch faster.

In general, while the capacitive node illustrated in FIGS. 1-4, 6 and 7 was shown in conjunction with a discrete capacitor circuit component, it should be understood that the capacitor may represent line and gate capacitances associated with other circuit components.

Figure 10:
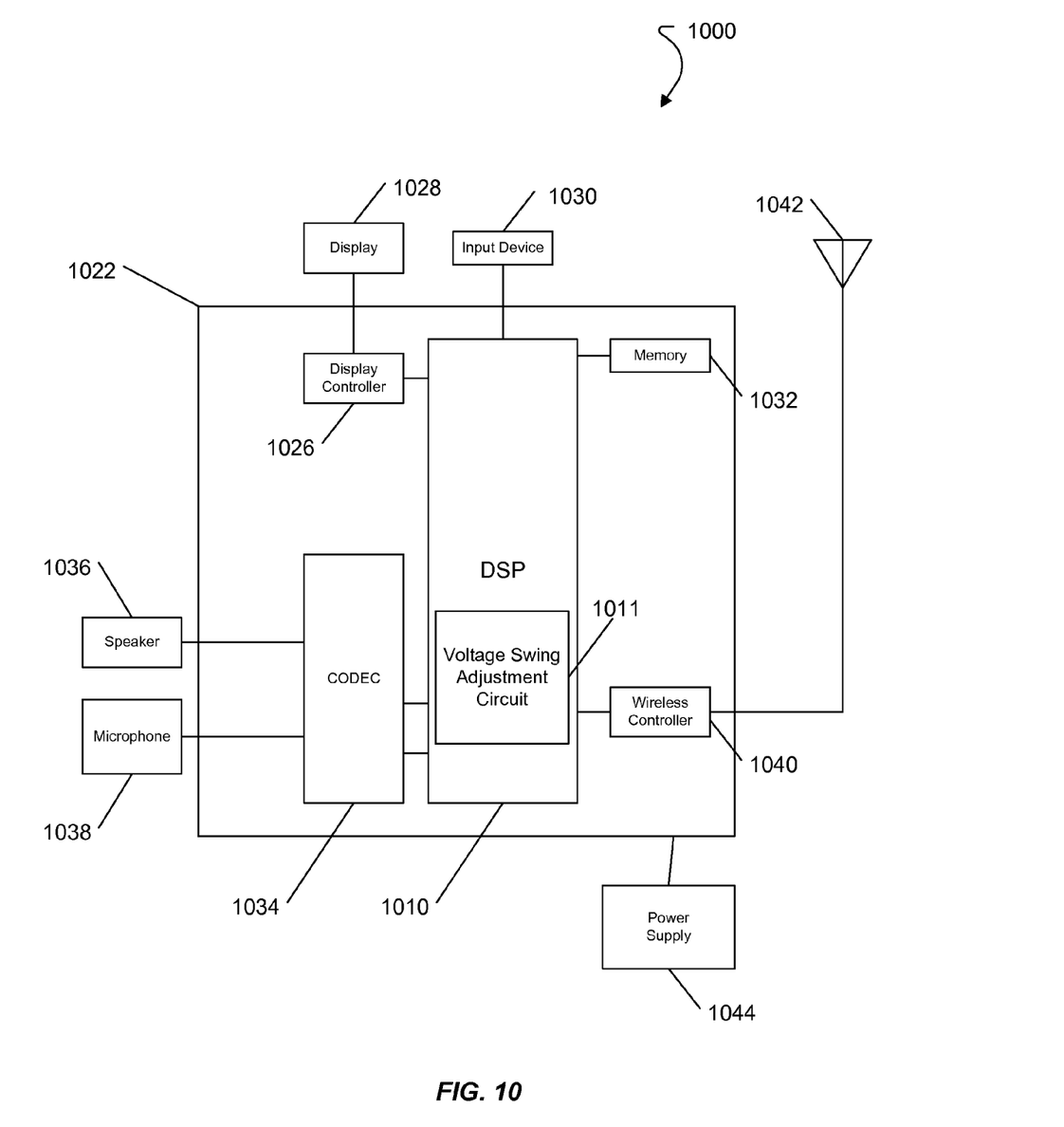
FIG. 10 is a block diagram of a wireless communication device that includes a circuit device and a method of controlling a voltage swing, such as the circuit devices and methods shown in FIGS. 1-4, 6, 7 and 9.

FIG. 10 is a block diagram of a wireless communication device 1000 that includes a circuit device to control a voltage swing 1011, which may be one of the circuit devices illustrated in FIGS. 1-4, 6 and 7 or which may implement the method illustrated and described with respect to FIG. 9. The portable communications device 1000 includes an on-chip system 1022 that includes a processor, such as a digital signal processor 1010. The digital signal processor 1010 includes at least one device having a voltage swing adjustment circuit 1011, as described with respect to FIGS. 1-4, 6, 7 and 9. In a particular illustrative embodiment, the voltage swing adjustment circuit 1011 may generate a reduced voltage swing signal to be used in high speed processors, such as the digital signal processor 1010, and system on chip devices, such as the on-chip system 1022. The reduced voltage swing signal may reduce active power consumption through reduced voltage swing on signal buses and clock buses. In a particular illustrative embodiment, the voltage swing adjustment circuit 1011 may provide the reduced voltage swing signal without impacting processing speed, without introducing separate power supplies, and with little circuit area impact. In a particular illustrative embodiment, the voltage swing adjustment circuit 1011 may be programmable to selectively adjust the range of the voltage swing.

FIG. 10 also shows a display controller 1026 that is coupled to the digital signal processor 1010 and to a display 1028. Moreover, an input device 1030 is coupled to the digital signal processor 1010. Additionally, a memory 1032 is coupled to the digital signal processor 1010. A coder/decoder (CODEC) 1034 can also be coupled to the digital signal processor 1010. A speaker 1036 and a microphone 1038 can be coupled to the CODEC 1034.

FIG. 10 also indicates that a wireless controller 1040 can be coupled to the digital signal processor 1010 and to a wireless antenna 1042. In a particular embodiment, a power supply 1044 is coupled to the on-chip system 1022. Moreover, in a particular embodiment, as illustrated in FIG. 10, the display 1028, the input device 1030, the speaker 1036, the microphone 1038, the wireless antenna 1042, and the power supply 1044 are external to the on-chip system 1022. However, each is coupled to a component of the on-chip system 1022.

In a particular illustrative embodiment, the voltage swing adjustment circuit 1011 may be used to enhance overall performance of the portable communications device 1000. In particular, a voltage swing adjustment circuit 1011 may reduce overall clock power consumption of the device 1000, thereby extending battery life, improving power efficiencies overall and enhancing the performance of the device 1000.

It should be understood that while the voltage swing adjustment circuit 1011 is shown only within the digital signal processor 1010, the voltage swing adjustment circuit 1011 may be provided in other components, including the display controller 1026, the wireless controller 1040, the CODEC 1034, or any other component that receives or uses a clock signal, such as a logical latch circuit, a logical flip-flop circuit, other clocked circuitry, or any combination thereof.

In general, embodiments of the voltage swing adjustment circuit 1011 provide significant advantages over prior are voltage swing reduction techniques. In a particular illustrative embodiment, the voltage swing adjustment circuit 1011 may provide as much as 33 percent power savings on a net of a circuit device without adversely impacting timing. Instead, because the voltage swing is reduced, the timing of the circuit may be enhanced, i.e., sped up. Additionally, the voltage swing can be reduced without introducing additional biases or extra power supplies. Embodiments disclosed herein include bypass logic to allow the device to bypass the power savings in particular instances. Moreover, the implementations illustrated and described herein may be scaled for higher voltages and can be mixed and matched based on robustness, timing and power tradeoffs to reduce a logic high voltage level, to increase a logic low voltage level, or both. Another advantage provided by embodiments of the voltage swing adjustment circuit 1011 is that the circuit reduces the voltage swing without compromising the signal integrity.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A method of controlling a voltage swing, the method comprising:
   receiving a clock signal at an input of a digital circuit device including a capacitive node;
   selectively activating a voltage level adjustment element to throttle an electrical discharge path from the capacitive node to an electrical ground to prevent complete discharge of the capacitive node;
   selectively asserting a power mode control enable signal to a control input of the voltage level adjustment element to activate the voltage level adjustment element in a first operating mode; and
   selectively deasserting the power mode control enable signal to bypass the voltage level adjustment element in a second operating mode.

2. The method of claim 1, further comprising adjusting a logic low voltage level based on a received signal.

3. The method of claim 1, further comprising applying a control signal to a voltage level control circuit coupled to the voltage level adjustment element to incrementally adjust a voltage level.

4. The method of claim 1, wherein the capacitive node comprises a terminal of a capacitor responsive to a logic circuit coupled to the input.

5. The method of claim 1, further comprising decreasing a logic high portion of a signal at the capacitive node to a high voltage level that is less than a voltage level of a high portion of the clock signal.

6. A method of controlling a voltage swing, the method comprising:
   receiving a clock signal at an input of a digital circuit device including a capacitive node;
   selectively activating a voltage level adjustment element to throttle an electrical discharge path from the capacitive node to an electrical ground to prevent complete discharge of the capacitive node;
   wherein the voltage level adjustment element increases a logic low voltage level at the capacitive node to a first voltage level that is greater than a ground voltage level such that the capacitive node discharges to the first voltage level instead of to the ground voltage level;
   receiving a first control signal at a voltage level control circuit coupled to the voltage level adjustment element; and
   increasing the logic low voltage level to a second voltage level that is greater than the first voltage level in response to the first control signal.

7. The method of claim 6, further comprising:
   receiving at least one second control signal at the voltage level control circuit; and increasing the logic low voltage level to a third voltage level that is greater than the second voltage level.

8. The method of claim 6, wherein the digital circuit device includes a first voltage supply and wherein the voltage level adjustment element increases the logic low a voltage level without providing a second voltage supply.

9. The method of claim 6, wherein the capacitive node comprises a terminal of a capacitor responsive to a logic circuit coupled to the input.

10. The method of claim 6, further comprising decreasing a logic high portion of a signal at the capacitive node to a high voltage level that is less than a voltage level of a high portion of the clock signal.

11. A circuit device comprising:
an input to receive a digital logic value;
a logic device responsive to the input;
a capacitive node coupled to the logic device; and
a voltage level adjustment element coupled to the capacitive node to increase a logic low voltage level to a voltage level above a logic low level of the input to reduce a voltage swing associated with the capacitive node;
wherein the voltage level adjustment element comprises a first transistor and a second transistor coupled in parallel between the capacitive node and an electrical ground, the first transistor including a first control terminal responsive to a power mode control enable input to selectively activate the voltage level adjustment element;
wherein the second transistor comprises a second control terminal coupled to a programmable voltage level control circuit;
wherein the programmable voltage level control circuit comprises:
a p-channel transistor including a first terminal coupled to a voltage source, a second terminal coupled to the input, and a third terminal coupled to the second control terminal; and
an n-channel transistor including a fourth terminal coupled to the third terminal; a fifth terminal coupled to the input; and a sixth terminal coupled to the capacitive node.

12. The circuit device of claim 11, wherein the digital logic value is provided by a clock signal and wherein the capacitive node is not completely discharged during a logic low portion of the clock signal.

13. The circuit device of claim 11, wherein the programmable voltage level control circuit includes one or more inputs to receive one or more control inputs, the programmable voltage level control circuit to control the voltage level adjustment element to incrementally increase the voltage level in response to receiving the one or more control inputs.

14. The circuit device of claim 11, wherein a discharge path through the second transistor is regulated based on a voltage level at the capacitive node.

15. The circuit device of claim 11, wherein the programmable voltage level control circuit further comprises:
one or more pairs of n-channel transistors, each pair of n-channel transistors comprising:
a first n-channel transistor including a seventh terminal coupled to the second control terminal, an eighth terminal coupled to the input, and a ninth terminal; and
a second n-channel transistor including a tenth terminal coupled to the ninth terminal, an eleventh terminal coupled to a control input; and a twelfth terminal coupled to the capacitive node.

16. A circuit device comprising:
means for receiving a clock signal at an input of a digital circuit device including a capacitive node;
means for selectively activating a voltage level adjustment element to throttle an electrical discharge path from the capacitive node to an electrical ground to prevent complete discharge of the capacitive node;
means for asserting a power mode control enable signal to a control input of the voltage level adjustment element to activate a voltage level adjustment circuit in a first operating mode; and
means for deasserting the power mode control enable signal to bypass the voltage level adjustment circuit in a second operating mode.

17. The circuit device of claim 16, wherein a voltage level at the capacitive node reduces a voltage swing of a signal at the capacitive node, such that the capacitive node discharges to a non-ground voltage level instead of to a ground voltage level.

18. The circuit device of claim 17, further comprising:
means for receiving a first control signal at a voltage level control circuit coupled to the voltage level adjustment element; and
means for increasing the non-ground voltage level to a second voltage level that is greater than the non-ground voltage level.

19. The circuit device of claim 16, further comprising means for adjusting a voltage level of a logic low portion of the clock signal based on a received instruction.

20. The circuit device of claim 16, further comprising means for applying a control signal to a voltage level control circuit coupled to the voltage level adjustment element to incrementally adjust a non-ground voltage level.

* * * * *